United States Patent [19]
Fleming et al.

[11] Patent Number: 5,802,702
[45] Date of Patent: Sep. 8, 1998

[54] METHOD OF MAKING A DEVICE INCLUDING A METALLIZED MAGNETIC SUBSTRATE

[75] Inventors: Debra Anne Fleming, Lake Hiawatha; David Wilfred Johnson, Jr., Bedminster; Vincent George Lambrecht, Jr., Millington; Henry Hon Law, Berkeley Heights; David Joseph Liptack, Hoboken, all of N.J.; Apurba Roy, Rockwall, Tex.; John Thomson, Jr., Spring Lake, N.J.

[73] Assignee: Lucent Technologies Inc., Murray Hill, N.J.

[21] Appl. No.: 923,591

[22] Filed: Sep. 4, 1997

Related U.S. Application Data

[63] Continuation of Ser. No. 696,441, Aug. 13, 1996, abandoned, which is a continuation of Ser. No. 268,465, Jun. 30, 1994, abandoned.

[51] Int. Cl.⁶ .................................................. H01F 41/04
[52] U.S. Cl. ............................. 29/608; 29/602.1; 29/852; 336/200
[58] Field of Search ................... 29/602.1, 607, 29/608, 606, 852; 336/200

[56] References Cited

U.S. PATENT DOCUMENTS

| | | | |
|---|---|---|---|
| 2,910,662 | 10/1959 | Rex | 336/200 |
| 3,185,947 | 5/1965 | Freymodsson | 29/602.1 X |
| 3,372,358 | 3/1968 | Roy et al. | 336/200 |
| 4,253,231 | 3/1981 | Nouet | 29/602.1 |
| 4,522,671 | 6/1985 | Grunwald et al. | |
| 4,775,465 | 10/1988 | Meinel | |
| 5,029,043 | 7/1991 | Kitahara et al. | |
| 5,136,120 | 8/1992 | Craft et al. | |
| 5,161,098 | 11/1992 | Balakrishnan | |
| 5,239,744 | 8/1993 | Fleming et al. | |
| 5,300,911 | 4/1994 | Walters | 29/606 X |
| 5,349,743 | 9/1994 | Grader et al. | 29/602.1 |
| 5,488,765 | 2/1996 | Kubota et al. | 29/602.1 X |

FOREIGN PATENT DOCUMENTS

| | | |
|---|---|---|
| 54-039322 | 10/1980 | Japan . |
| 56-120058 | 2/1983 | Japan . |
| 56-152447 | 3/1983 | Japan . |
| 58-247125 | 7/1985 | Japan . |
| 59-212335 | 5/1986 | Japan . |
| 62-254879 | 4/1989 | Japan . |
| 63-297083 | 6/1990 | Japan . |
| 1-297487 | 7/1991 | Japan . |
| 2-2552-208 | 7/1992 | United Kingdom . |

OTHER PUBLICATIONS

Abstract: "Development of Miniaturized DC–DC Converter with Multilayer Ceramic Transformer", Takaya, Mochizuki, Nakano, Kobuke, Authors; pp. 269–274, ISHM '92 Proceedings.

"An Inductor/Capacitor Hybrid Made of Ferrite Only", Sakak, Author; pp. 3009–3011, IEEE Transactions on Magnetics, vol. 28, No. 5, Sep. 1992.

"Design of High–Frequency Hybrid Power Transformer", Grtadzki and Lee, Authors; pp. 319–326, IEEE, 1988/CH2504–9/88/0000–0319.

"Electronic Materials Handbook", vol. 1–Packaging , prepared/ASM International, Handbook Committee, of ASM International, Materials Park, OH 44073, pp. 187–189.

*Primary Examiner*—Carl E. Hall
*Attorney, Agent, or Firm*—Eugen E. Pacher

[57] ABSTRACT

The method of making a metallized magnetic substrate for devices including a magnetic component involves providing an unfired ceramic body. In one exemplary embodiment, the method further involves making one or more vias through the ceramic body, coating the via side walls with conductive material, forming an aperture through the ceramic body, such that an aperture edge intersects the via, and metallizing the unfired ceramic body such that a conductive pathway is formed that includes the conductive material in the via. Finally, the metallized unfired ceramic body is fired in conventional fashion, optionally followed by deposition of additional conductor material.

12 Claims, 13 Drawing Sheets

• — LINEAR INTEGRATED INDUCTOR

N = 7 TURNS

FERRITE SUBSTRATE THICKNESS= .050"

METHOD OF MAKING A DEVICE INCLUDING A METALLIZED MAGNETIC SUBSTRATE

This application is a continuation of application Ser. No. 08/696,441, filed on Aug. 13, 1996, now abandoned, which is a continuation of application Ser. No. 08/268,465, filed on Jun. 30, 1994, now abandoned.

FIELD OF THE INVENTION

The invention relates to devices formed from metallized magnetic substrates and, more particularly, to devices which include one or more magnetic components as an integrated part of a metallized substrate.

BACKGROUND OF THE INVENTION

Magnetic components such as inductors and transformers are widely employed in circuits requiring energy storage and conversion, impedance matching, filtering, EMI suppression, voltage and current transformation, and resonance. These components, as currently constructed, tend to be bulky and expensive as compared to other components of the circuit. Conventional manufacturing methods typically involve wrapping conductive wire around a magnetic core element or an insulating former (i.e. bobbin) containing core material. These methods result in high-profile circuit components which restrict miniaturization of devices in which such components are incorporated.

The size of such components is a particular problem in power circuits, such as AC-DC and DC-DC power converters. Despite the trend towards low profiles and miniaturization in other electronic devices, power converters remain bulky due, in large part, to the high profiles, large footprints, and high thermal resistances of the inductors and transformers. In addition, the limited ability of conventional magnetic components to transfer heat from the core and conductive windings to the device case or heat sink necessitates larger surface areas for the entire device. (See E. C. Snelling, "Soft Ferrites", 2nd Ed., Butterworth and Co. Ltd., pp. 284–285).

Recent efforts to reduce the size of magnetic components have included thick film and multilayer green tape techniques. In the thick film technique, magnetic components are constructed by a sequence of thick film screen print operations using a ferrite paste and a conductor paste. Sintering produces a ferrite body containing a spiral conductive winding made up of planar segments. In the green tape approach, the screen printed ferrite paste layers are replaced by ferrite green tape layers on which the planar winding segments are printed. Both approaches yield magnetic components with conductive windings substantially buried within the ferrite body. This results in relatively high winding resistances, due to limitations imposed by suitable co-sinterable conductor materials and maximum printed conductor thickness. Thus, these processes are generally limited to the fabrication of low current or low power devices.

SUMMARY OF THE INVENTION

The present invention provides novel devices including magnetic components and novel methods for making them. In a first aspect, the invention provides a device comprising a metallized magnetic substrate having an aperture. At least one metallized path passes through the aperture and around a portion of the substrate to define a magnetic component which has a flux path in the plane of the substrate and substantially confined within the substrate. The winding can pass around a substrate edge or through a second aperture. Advantageously, other circuit elements such as metallized interconnects and electronic components are disposed on the substrate to form a device.

In a further aspect, the invention provides methods for metallizing magnetic substrates to form devices including magnetic components. In one embodiment, a green ceramic body comprising at least one ceramic layer is provided in an unfired state. At least one aperture having at least one conductively coated side wall pathway is formed within each ceramic layer. Top and bottom surface portions of the ceramic body are metallized such that the metallized surface portions form a continuous conductive region with the side wall conductive pathway to create a conductive winding about the ceramic body. The ceramic body with the conductive winding formed thereon is fired to yield a substrate including a magnetic component. Preferably after sintering, additional metal is plated on the conductive regions to enhance current-carrying capacity.

BRIEF DESCRIPTION OF THE DRAWINGS

FIG. 4A illustrates the metallized substrate with magnetic component, while FIG. 4B illustrates the metallized substrate of FIG. 4A with additional circuit elements to form a device.

DETAILED DESCRIPTION

Turning now to the drawings in which like numerals indicate the same or similar elements in each of the several views, FIGS. 1A through 1D illustrate various magnetic components formed from a metallized substrate according to the present invention. In describing these components and their fabrication, the following terms will be used with some frequency. As used herein, the term "substrate" broadly denotes an element used to support other circuit elements including, but not limited to, conductor paths, discrete components, integrated circuits, etc. Additionally, the term "substrate" includes those elements which perform a support function and have portions which are part of a component. Typically a substrate comprises a body of material having a substantially planar substrate support surface.

The term "layer" as used herein broadly denotes a portion of a substrate, e.g., a ceramic green tape layer, which, when laminated and fired with other ceramic green tape layers, forms a substrate. The term "via" as used herein refers to an opening which passes through a layer or body. Typical vias are square or circular in cross section The term "aperture" refers to an opening generally larger than a via and which may include one or more vias in its construction. Typical apertures are rectangular or oval in cross section. It is sufficient that the aperture is substantially surrounded by the substrate. Thus, an aperture can have a portion which communicates with the substrate edge. A preferred aperture transverse shape is an elongated rectangular opening having one or more crenelated side walls.

Figure 1A:
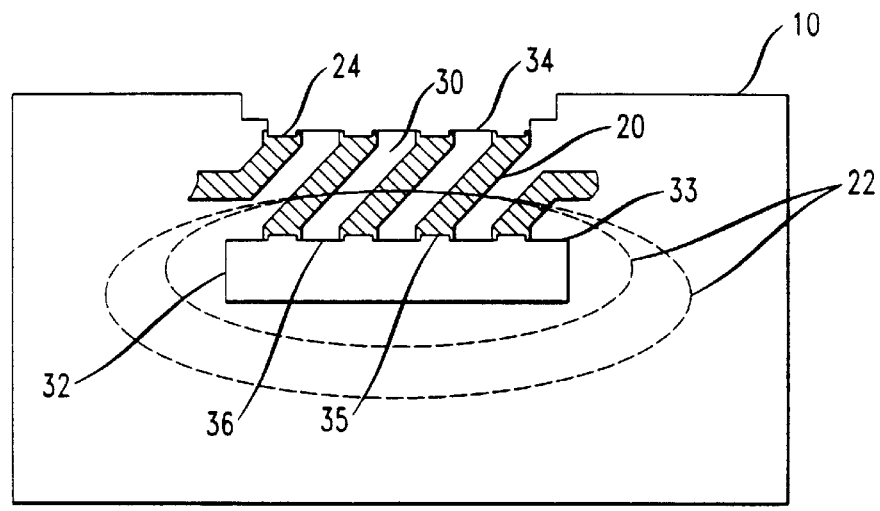
FIGS. 1A, 1B, 1C and 1D illustrate magnetic components according to the present invention.

FIG. 1A illustrates a component comprising an ungapped inductor wherein metallized substrate 10 incorporates an inductor having a winding 20 surrounding a core element 30. The winding includes generally horizontal portions 20 which span a portion (the core element) of the substrate 10 on both the upper surface and the lower surface (not shown). Vertical winding portions 24 (see FIG. 4A) connect the horizontal winding portions 20 between adjacent layers to form a continuous coil surrounding the core element. In the inductor of FIG. 1A, winding 20 passes through an aperture 32 and around a substrate edge 34 to surround a portion of substrate 10 disposed between the aperture and the substrate edge, defining the magnetic component and the region of substrate 10 which functions as the component core. The aperture, and the conductive winding when energized, confine the flux path 22 of the inductor to the plane of the substrate and substantially within the substrate. Advantageously, the aperture 32 has at least one crenelated side wall 33 comprising an alternating sequence of recessed regions 35 and projecting regions 36. The vertical winding portions 24 can be formed in the recessed regions 35 as shown or, alternatively, they can be formed on the projecting regions 36.

Figure 1B:
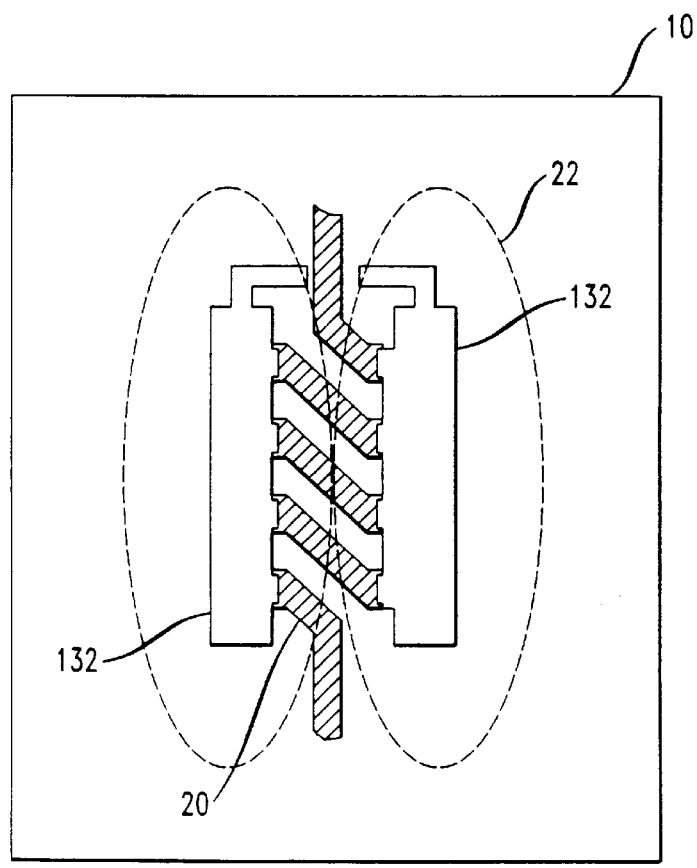

FIG. 1B illustrates a component comprising a partially gapped inductor. The inductor of FIG. 1B is similar to FIG. 1A except that a pair of apertures 132 are formed in the substrate 10. Preferably the apertures are aligned so that their major dimensions are parallel. The winding 20 passes through apertures 132 to surround a portion of substrate 10 disposed between the apertures. As in the inductor of FIG. 1A, the apertures and the conductive winding define the magnetic component and, when the winding is energized, confine the flux path 22 of the inductor to the plane of the substrate and substantially within the substrate. Each aperture preferably has a crenelated side wall.

Figure 1C:
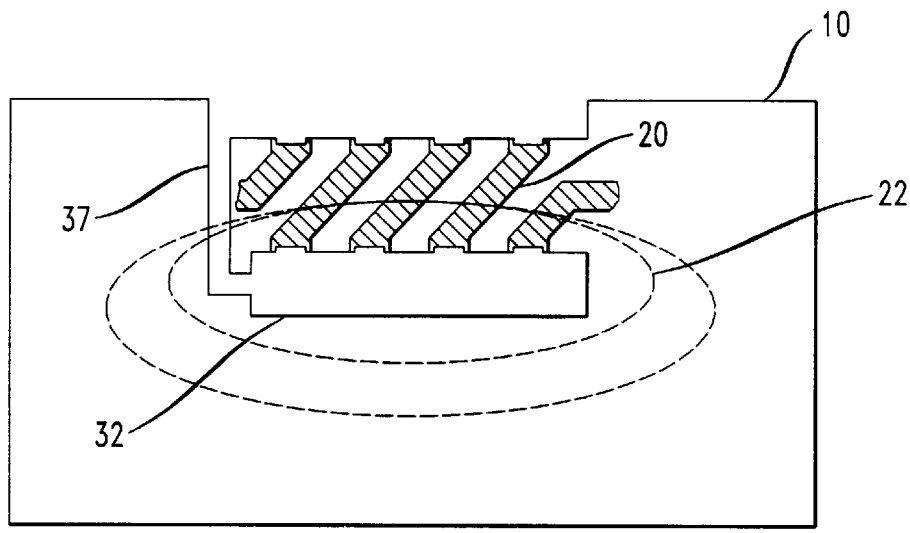

The FIG. 1C component is similar to that of FIG. 1A except that the aperture 32 has been extended to communicate with the substrate edge. The extension 37 forms the gap of a gapped inductor.

Figure 1D:
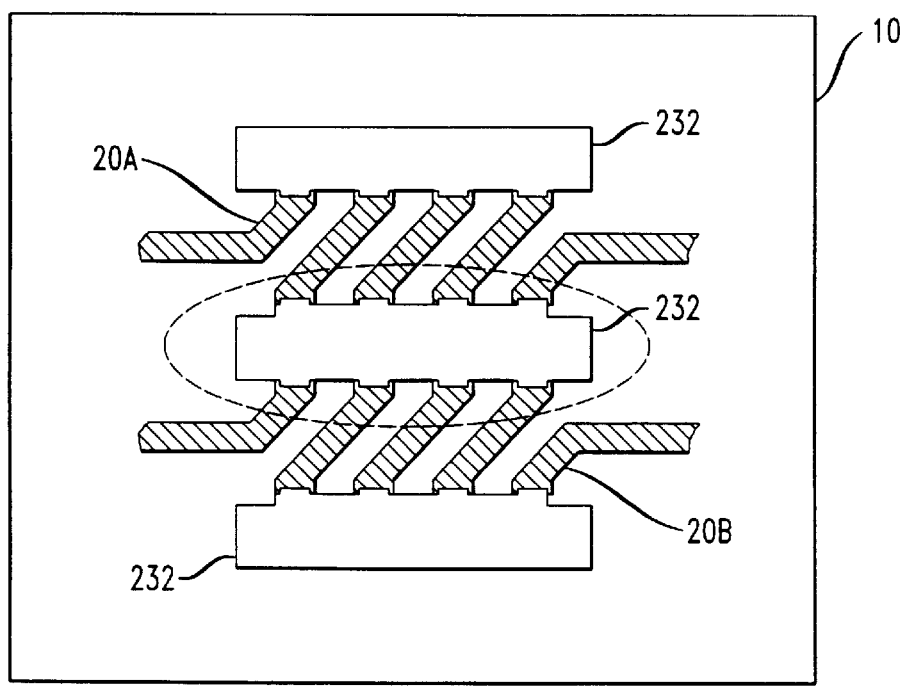

The FIG. 1D component is similar to that of FIG. 1B, except that three apertures 232 are used to form two pairs of windings 20A and 20B, thus forming a transformer. Each aperture preferably has a crenelated side wall and the center aperture has two such walls.

FIGS. 2A–2G illustrate a first process for forming metallized substrates including magnetic components such as illustrated in FIGS. 1A–1D. The figures depict a process on only a single layer, the uppermost layer of a structure comprising at least one layer. In addition, while the process is described in terms of formation of a single magnetic element per individual substrate, the process described herein can be used to form multiple magnetic components per individual substrate including, but not limited to, inductors and transformers.

Figure 2A:
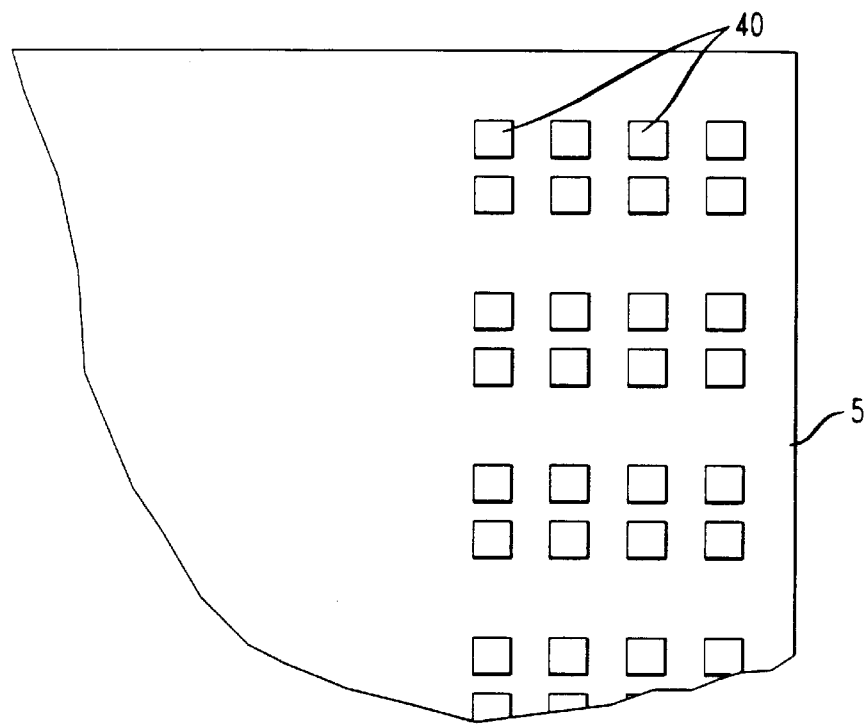
FIGS. 2A, 2B, 2C, 2D, 2E, 2F, and 2G illustrate the formation of a metallized substrate including a magnetic component according to a first embodiment of the present invention.

FIG. 2A illustrates a layer of material 5 used in the process of the present invention. To form a magnetic element, material 5 is selected from any magnetic material which can be metallized including, but not limited to, magnetic ceramics and polymers loaded with magnetic particles. As described in the process of FIGS. 2A–2G, magnetic material 5 is a magnetic ceramic material in a green tape format. The magnetic ceramic material includes a spinel ferrite of the form $M_{1+x}Fe_{2-y}O_{4-z}$ where the values for x, y, and z may assume both positive and negative numerical values. The M material normally includes at least one of the elements Mn, Ni, Zn, Fe, Cu, Co, Zr, Va, Cd, Ti, Cr, and Si. Exemplary ferrites are those ferrites which have high resistivities such as nickel-zinc ferrites and certain manganese-zinc ferrites.

Magnetic material layer 5 is provided in an unfired green state. The ceramic powders used to form the layer are typically mixed with a suitable organic binder and cast in the form of a tape. The green tapes are cut to form individual layers. At this stage, forming and metallization processes can be performed on individual layers, or several layers can be stacked and laminated under low pressure in the range of 500–3000 psi at a temperature on the order of 50°–100° C. to form a composite structure for further processing. Formation of multilayer ceramic substrates from individual green tape layers is described in U.S. patent application Ser. No. 07/695,653 to Grader et al. and U.S. Pat. No. 5,239,744 to Fleming et al., both assigned to applicant's assignees, the disclosures of which are incorporated herein by reference.

As shown in FIG. 2A, following formation of layer 5, openings are created to form vias 40 which intersect the top and bottom surfaces of material layer 5 and have vertical side walls. Vias 40 can possess a variety of geometries such as the illustrated square cross-sections or circular cross-sections. Typically, the vias are created by punching the magnetic ceramic layer in a suitable punch press having a male punch corresponding to the size and shape of the via to be formed. However, any technique capable of forming vias in a ceramic green tape is acceptable.

Figure 2B:
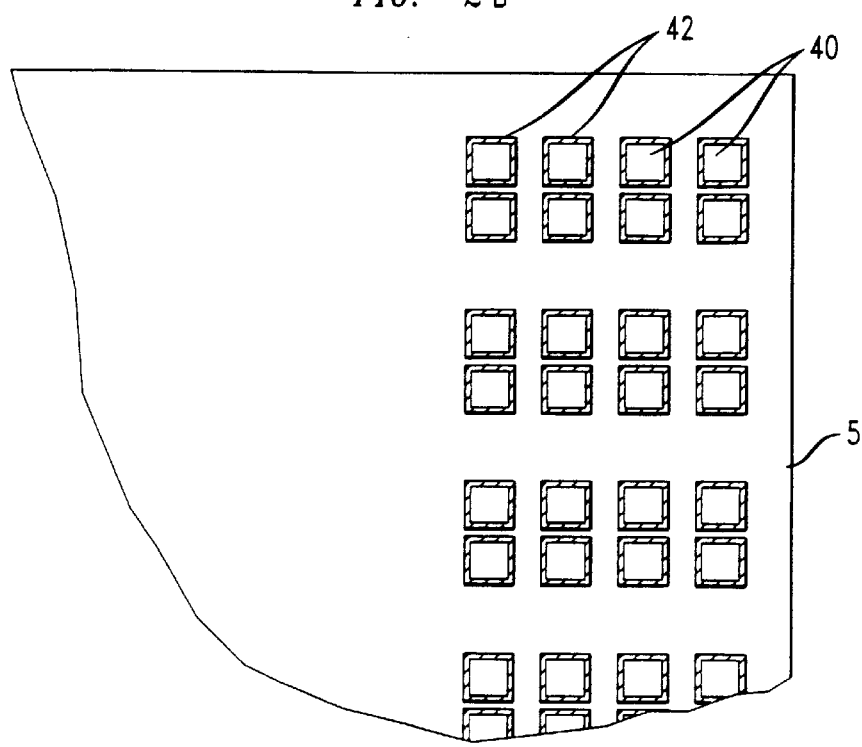

As depicted in FIG. 2B, vias 40 are then printed with a conductive ink on the vertical side wall surfaces to form conductive vias 42 (vias with continuous conductive side walls). Exemplary conductive inks are silver, palladium, or silver-palladium inks such as those commercially available from Ceronics Inc. Matawan, N.J. The conductive inks generally comprise a metallic particulate suspension in an organic binder which can be screen printed. The ink is typically printed through a metal mask using vacuum suction to coat the side wall surfaces of each via 40 to form conductive vias 42.

Figure 2C:
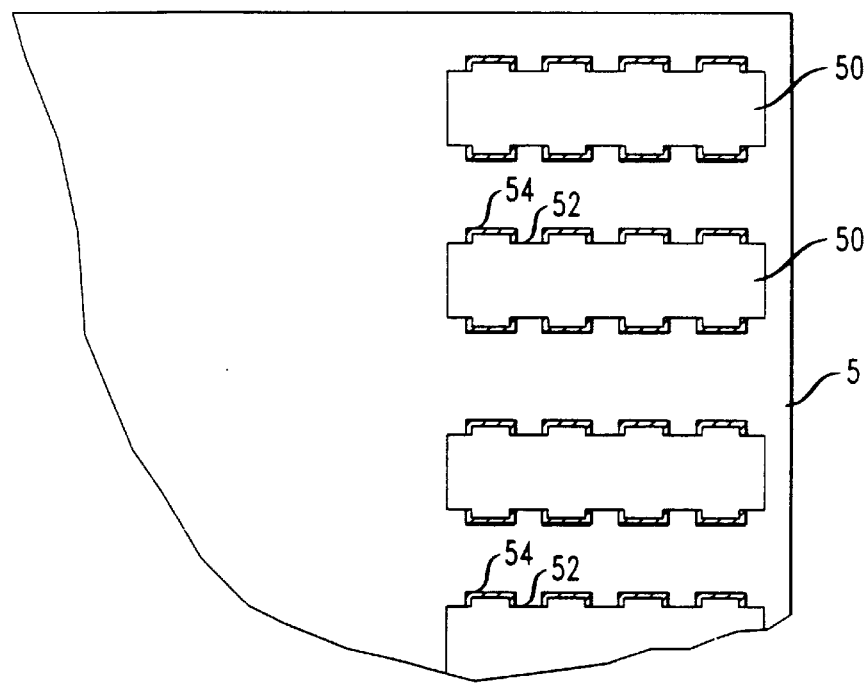

Following formation and printing of conductive vias 42, apertures 50 are created in the tape layer as shown in FIG. 2C. Apertures 50 include aperture edges 52 which partially define the boundaries of the magnetic component. For the inductor of FIG. 1A, aperture edges 52 partially define the area of core element 30. Apertures 50 are formed such that an aperture edge 52 intersects at least one of the vias 40. When aperture edge 52 intersects a plurality of vias, as illustrated in FIG. 2C, a magnetic component crenelated edge is created which includes a periodic array of plural vertical conductive edge vias 54 separated by non-metallized insulating regions. When forming apertures in individual green tape layers, registration holes are typically formed in non-device-forming regions. Registration rods are typically inserted in the registration holes to assure alignment of the apertures from each of the layers used to create the final substrate.

Figure 2D:
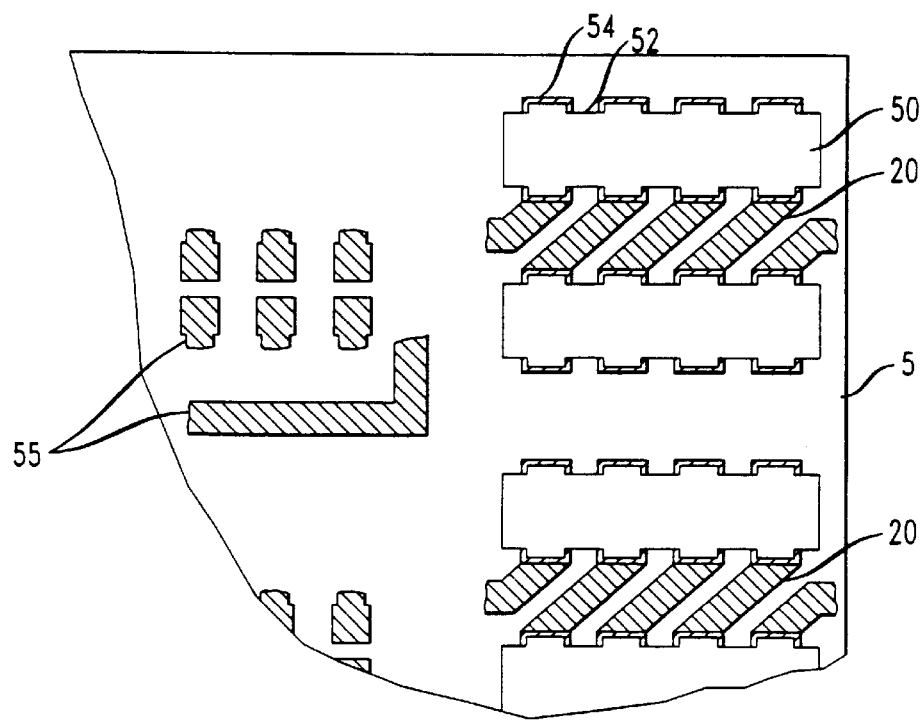

As shown in FIG. 2D, following formation of apertures 50, surface metallization is screen printed onto the tape layer, using a conductive ink similar to that used to form conductive vias 42. This surface metallization includes horizontal winding portions 20. Since the horizontal winding portions traverse only on the top and bottom substrate surfaces as for example in the inductor of FIG. 1A, this process is performed only on the top side of the upper most tape layer and the bottom side of the lower most tape layer. Horizontal winding portions 20 electrically connect with metallized vertical edge vias 54 to form a continuous conductive winding which, following lamination of the individual tape layers and sintering, surrounds the portion of substrate 10 which forms the core of the magnetic component. The screened surface metallization also includes interconnection conductor patterns 55, as depicted in FIG. 2D. Patterns 55 include circuit lines and surface mount pads for attaching other electronic components onto the substrate 10. This permits the incorporation of magnetic and non-magnetic circuit elements in a single device.

Figure 2E:
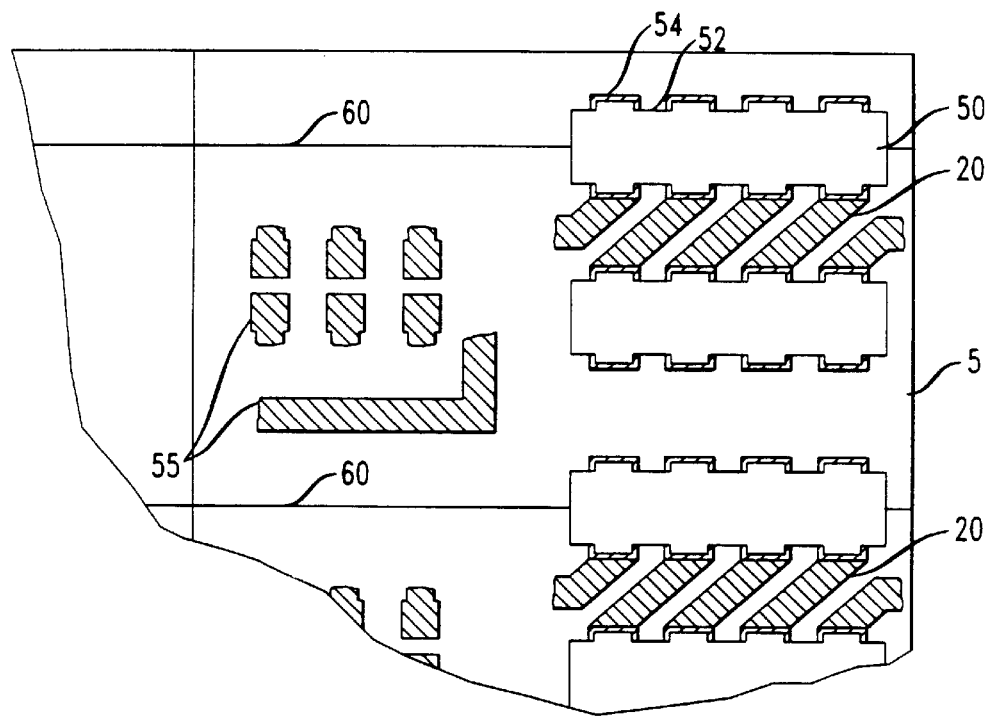

After screen printing the upper most and lower most layers, the individual tape layers are laminated, as described above, to form a multilayer green body. When desiring to form a plurality of individual substrates having the inductor of FIG. 1A disposed thereon, an array of substrates may be formed in the individual tape layers, as depicted in the drawings. To facilitate separation of the substrates following sintering, dice lines 60 are scribed into the laminated structure as illustrated in FIG. 2E. Following the scribing of the dice lines, the multilayer structure is sintered between 800° C. and 1400° C. to form a co-fired metallized ceramic substrate.

Figure 2F:
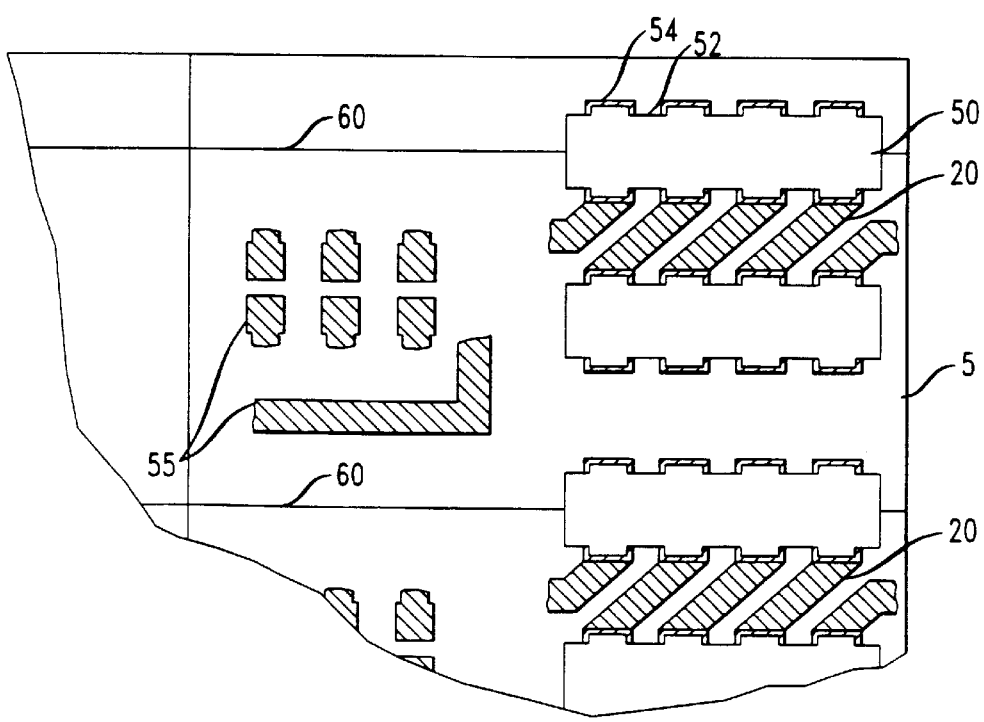
Figure 2G:
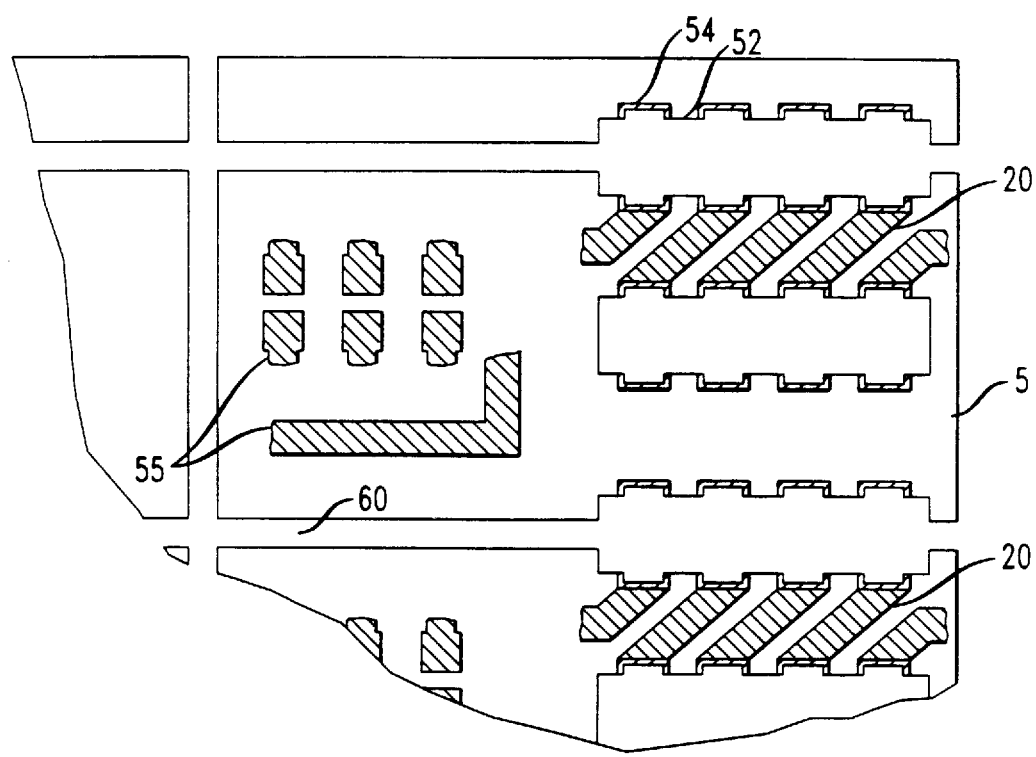

To increase the current-carrying capacity of the windings and other surface metallization, the metallized regions are further plated with additional metal such as copper and nickel as depicted in FIG. 2F. Copper plating may be performed by any plating technique with electrolytic plating being exemplary. When forming the inductor of FIG. 1A, a layer of copper is electrolytically deposited followed by the electrolytic or electroless deposition of nickel. As depicted in FIG. 2G, the substrate is then divided along dice lines 60 to yield individual substrates. Note that the process using conductive vias 42 and apertures 50 to form crenellated side walls is used advantageously to provide the vertical winding portions 24 both through the aperture 32 and around the edge 34 of the magnetic component depicted in FIG. 1A.

Figure 3A:
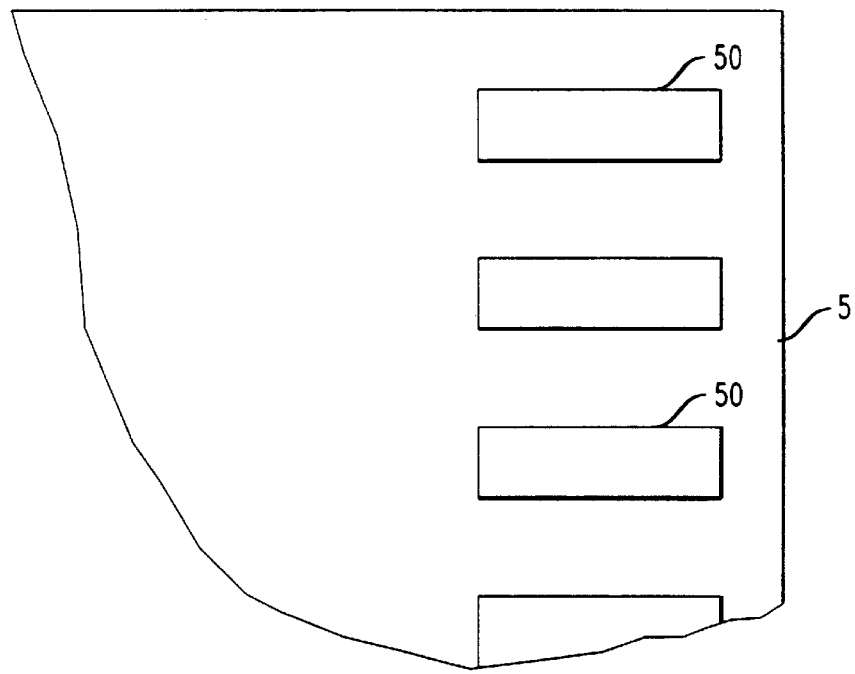
FIGS. 3A, 3B, 3C, 3D, 3E, 3F, and 3G illustrate the formation of a metallized substrate including a magnetic component according to a second embodiment of the present invention.
Figure 3B:
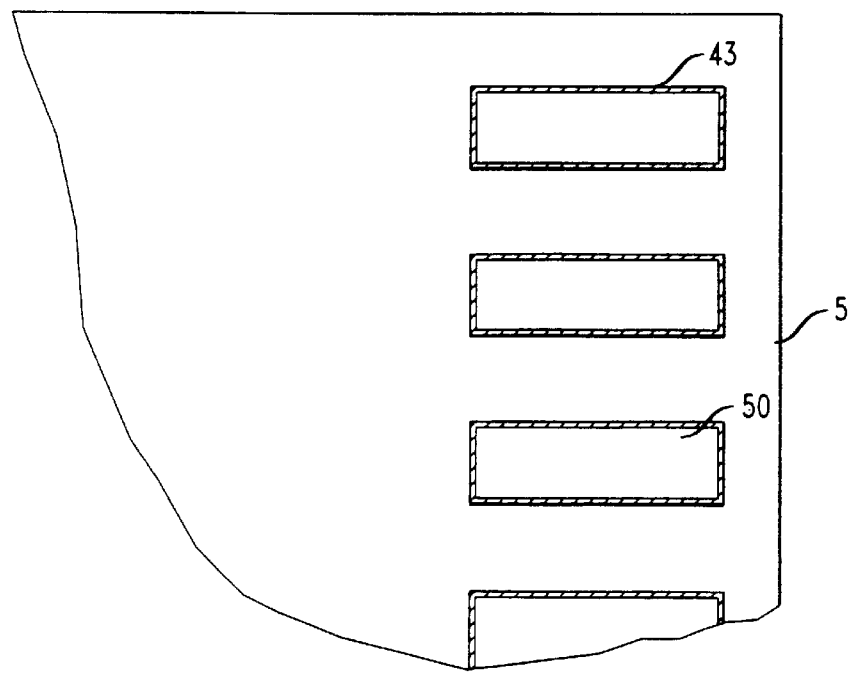
Figure 3C:
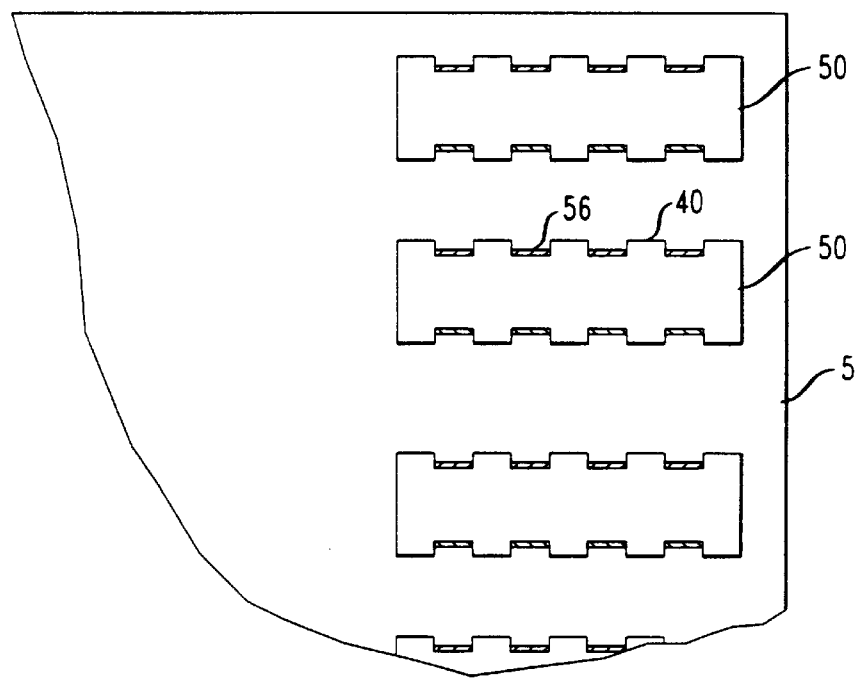
Figure 3D:
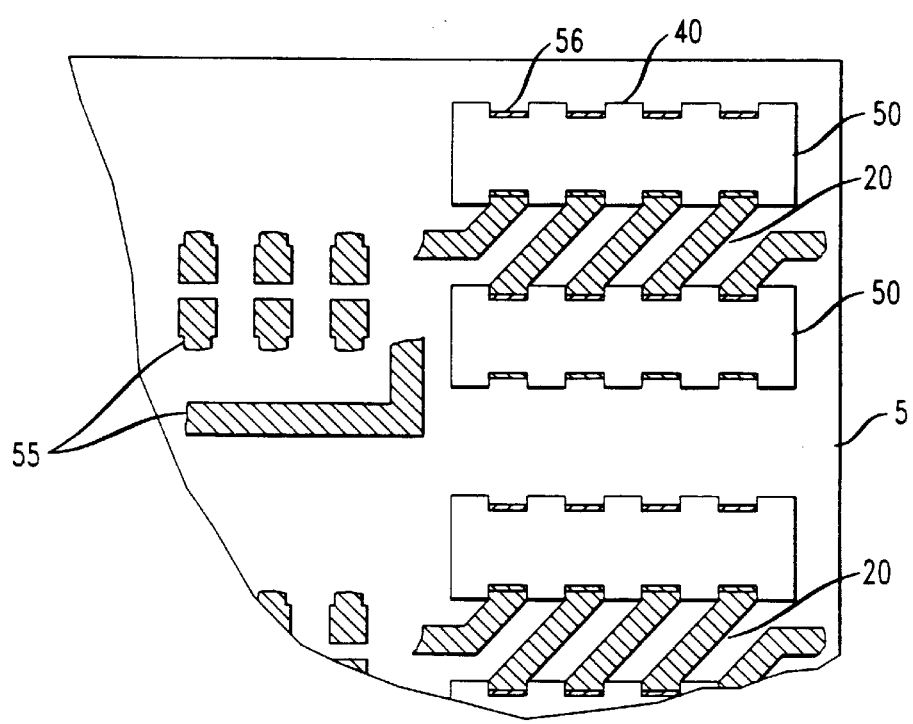
Figure 3E:
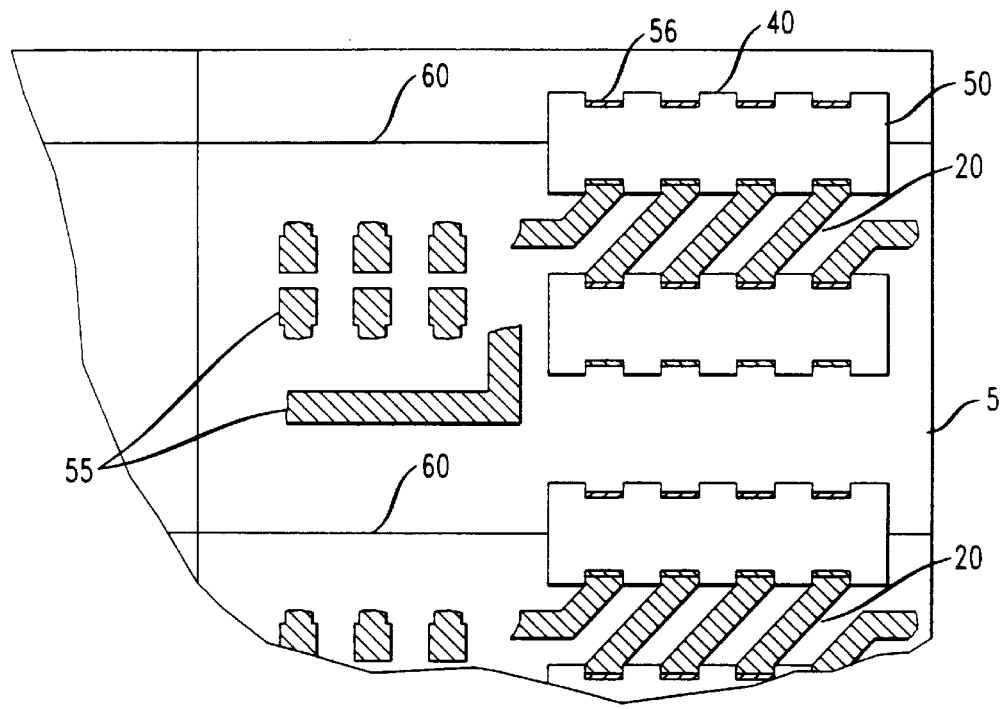

An alternate embodiment used to form metallized substrates including the components of FIGS. 1A–1D is illustrated in FIGS. 3A–3G. The process of FIGS. 3A–3G is substantially similar to the process of FIGS. 2A–2G. However, the vias are formed following the formation of the larger apertures. In FIG. 3A, apertures 50 are created in layer 5 followed by printing with conductive ink to form conductive side walls 43 as shown in FIG. 3B. Vias 40 are punched in FIG. 3C such that the vias intersect the edges of apertures 50. Formation of vias 40 create crenelated side walls composed of conductive side wall portions 56 separated by the non-metallized side walls of vias 40, thus defining side wall conductive pathways. In FIG. 3D, horizontal winding portions 20 and interconnection conductor patterns 55 are printed followed by lamination, scribing of dice lines in FIG. 3E, sintering, additive copper and nickel plating in FIG. 3F, and singulation along dice lines 60 in FIG. 3G.

Figure 3F:
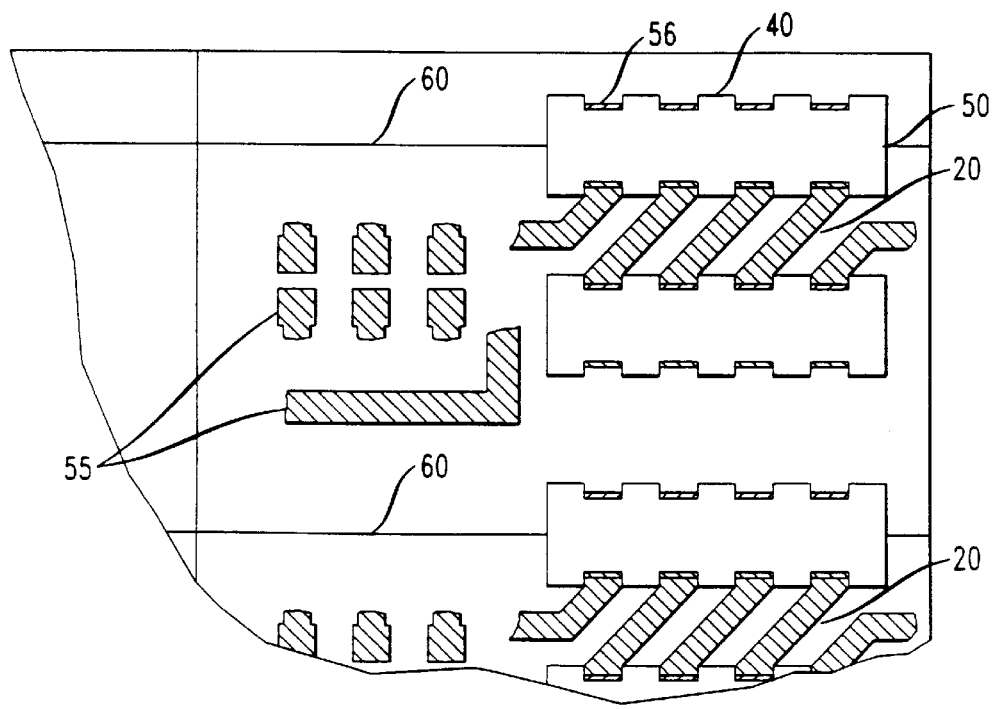
Figure 3G:
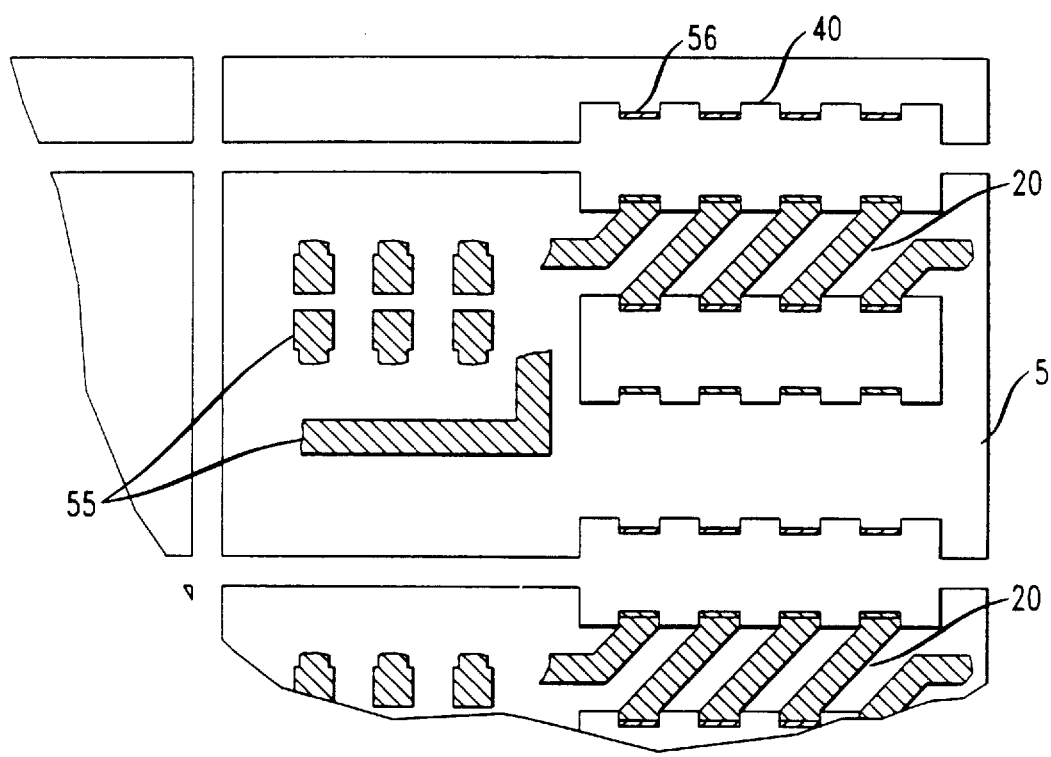

A third embodiment to form metallized substrates including the components of FIGS. 1A–1D uses the processes of FIGS. 2A–2C or FIGS. 3A–3C, followed by lamination and sintering to create co-fired substrates including apertures with crenelated side walls. As shown by FIG. 2C or FIG. 3C, these crenelated side walls comprise a plurality of conductive vertical portions 54 or 56, separated by non-metallized insulating vertical regions. The top and bottom surfaces of the substrate are then metallized, to form horizontal winding portions 20 electrically connected to vertical portions 54 or 56, and interconnection conductor patterns 55, such as depicted in FIG. 2D or FIG. 3D. The surface metallization step, either a screen print thick film technique or photolithography, is followed by additive copper and nickel plating, as shown in FIG. 2F or FIG. 3F, and singulation. As exemplary photolithography process is described in U.S. patent application Ser. No. 08/156185, by Kossives et al., assigned to applicants' assignee, which is incorporated herein by reference.

Further advantages of the present invention are demonstrated in the following Examples which show the fabrication of a metallized substrate including a magnetic component according to the processes of FIGS. 2A–2G, and the fabrication of a device using that substrate.

EXAMPLE 1

Figure 4A:
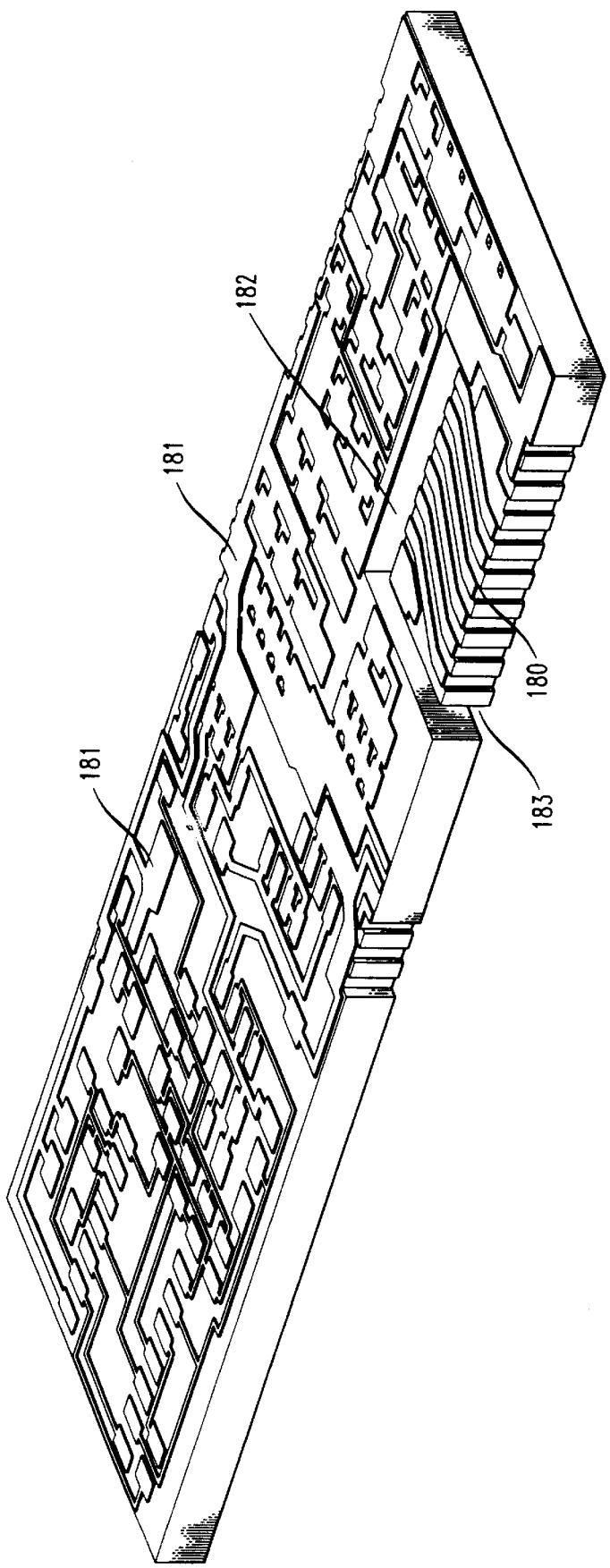
FIGS. 4A and 4B illustrate a metallized substrate incorporating a magnetic component according to the present invention.

A metallized substrate including a magnetic component, shown in FIG. 4A, was fabricated using the processes illustrated in FIGS. 2A–2G. Ferrite green tape was made from a nickel-zinc ferrite powder with approximate composition $Ni_{0.4}Zn_{0.6}Fe_{2.0}O_4$, available commercially from Steward Inc. (Chattanooga, Tenn.). 156 grams of the powder was milled with 41.88 grams of methyl ethyl ketone and 72.97 grams of toluene for 16 hours in a vibratory mill using $ZrO_2$ milling media. A polycarbonate binder commercially available as Q-PAC (Air Products) was added to the milled mixture along with 1.36 grams of SANCTICIZER 130 plasticizer and 2.34 grams of Menhaden fish oil dispersant to create a tape-casting slurry. The tape-casting slurry was subsequently milled for 4 hours.

The green ferrite tape was cast into 6.75" wide by 5' long sheets approximately 16 mils thick via a doctor blade process and allowed to dry overnight. The tape was stripped from the casting surface and punched into 5" square blanks for subsequent operations.

Via patterns similar to those in FIG. 2A were obtained by punching to produce 30×30 mil square vias in individual green tape layers. A silver-palladium paste was printed through a metal mask using vacuum assist to coat the vertical side wall surfaces of each via to form conductive vias, as depicted in FIG. 2B. Apertures were then punched in each tape layer such that the apertures edges intersected the vias, as illustrated in FIG. 2C, to form crenelated edges including a plurality of conductive edge vias. This pattern of apertures and conductive edge vias was formed on 4 layers of tape.

Silver-palladium paste was then used to screen print surface metallization patterns on the top side of the upper most tape layer and the bottom side of the lower most tape layer. As shown in FIG. 4A, the surface metallization comprised horizontal winding portions 180 for the magnetic component, as well as interconnection conductor patterns 181 including circuit lines and surface mount pads for attaching other electronic components.

The 4 tape layers were then laminated together and sintered at 1145° C. for 10 hours to produce a co-fired metallized ferrite substrate, 50 mils thick.

To increase the thickness of the co-fired metallized regions, copper was deposited electrolytically using a CUPRACID copper plating bath commercially available from Atotech, State College, Pa. The plating bath was held at 25° C. with a brightener concentration of 3 ml/L and a leveler concentration of 15 ml/L. Using air and mechanical agitation, the plating rate was approximately 1.67 mil/hour. Copper was plated to approximately 3 mil thickness over the co-fired metallization.

Nickel was deposited over the copper metallization using a commercial electroless nickel bath, NIKLAD 1000, available from the Allied-Kelite Division of Witco (Melrose Park, Ill.).

The finished substrate, shown in FIG. 4A, included the magnetic component defined by the winding depicted by 180, and the aperture 182. This component was a gapped inductor, similar to FIG. 1C, with the gap formed by the extension 183 of the aperture 182. The winding comprised 7 turns, surrounding a 200 mil portion of the substrate. The incremental inductance characteristic of this inductor, $L_S$ vs. $I_{DC}$ (DC current), is shown in FIG. 4C.

EXAMPLE 2

Figure 4B:
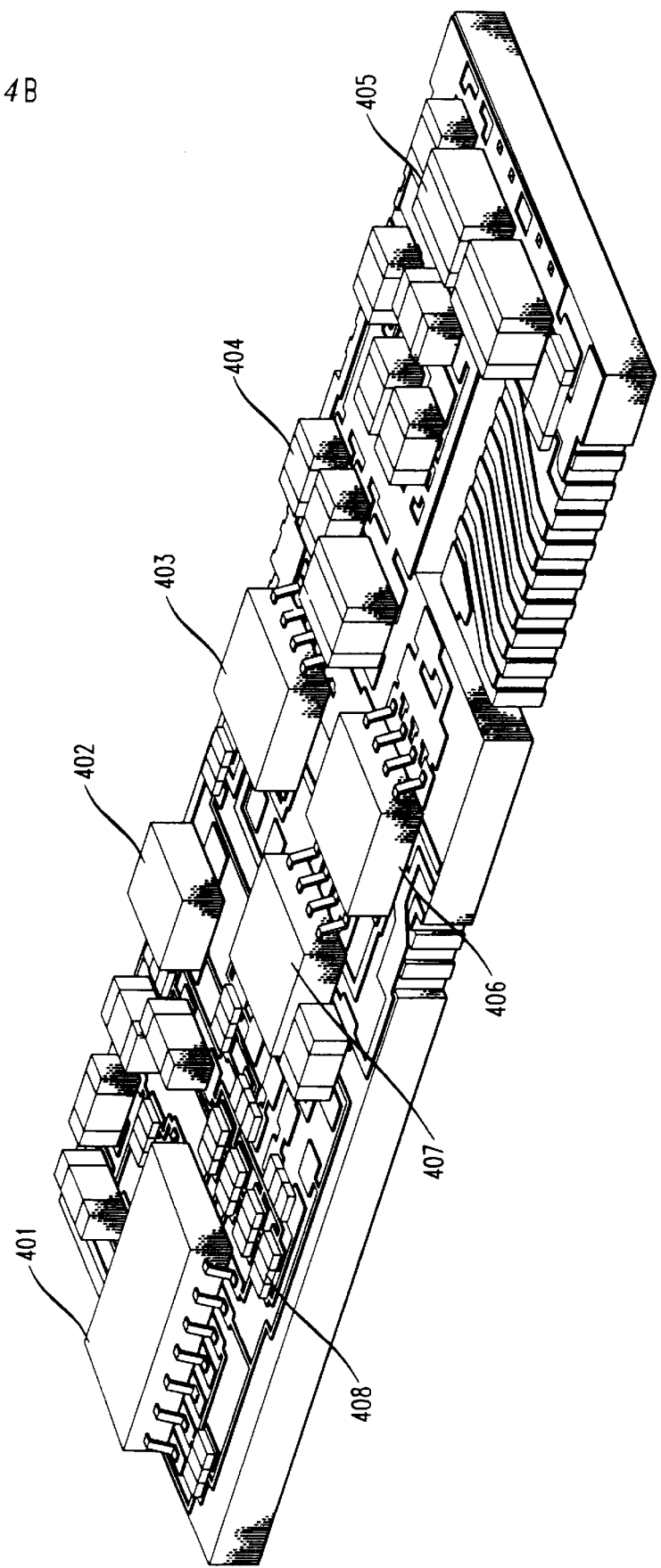
Figure 4C:
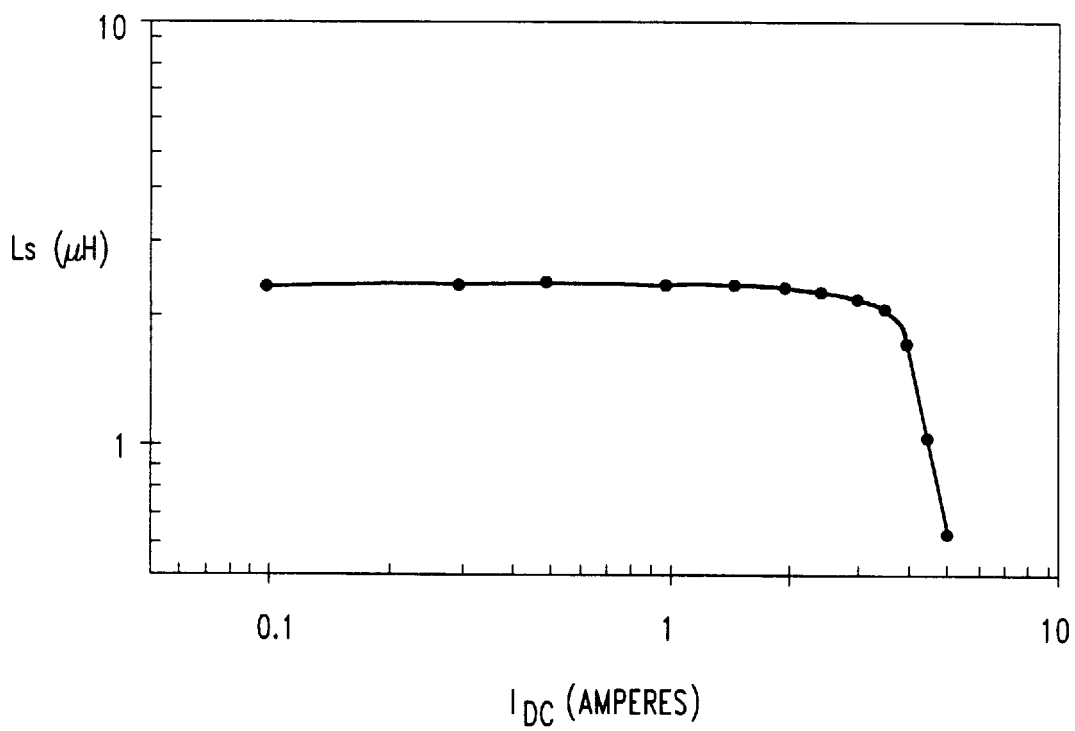
FIG. 4C illustrates the incremental inductance characteristics of the magnetic component of FIG. 4A and FIG. 4B.

A device comprising a DC-DC power converter, shown in FIG. 4B, was fabricated using the metallized substrate of FIG. 4A, including the inductor described in EXAMPLE 1. Several types of commercial components were attached by solder reflow to the surface mount pads in the conductor pattern 181 of FIG. 4A. As shown in FIG. 4B, these included, for example, a 556 timer IC 401, a reference voltage IC 402, a p-channel field effect transistor 403, a n-channel field effect transistor 406, a ceramic capacitor 404, a tantalum capacitor 405, a transistor driver 407, and a ceramic resistor 408.

Circuit traces, part of the pattern 181, interconnected these components and the inductor to form a DC-DC converter circuit of the step-down, or buck type. The inductor comprised the magnetic energy storage element for this device, which converted 5V DC to 3.3V DC, with a maximum output power of 10 W. No external heat sinks were required. The overall size was 2.000 in×0.650 in×0.140 in high, thereby providing for a power converter device with a small footprint and a very low profile.

While the foregoing invention has been described with reference to the above embodiments, various modifications and changes may be made without departing from the spirit of the present invention. Accordingly, modifications and changes such as those suggested above, but not limited thereto, are considered to be within the scope of the claims.

We claim:

1. A method for making a device including at least one magnetic component, the device comprising a metallized substrate of ceramic magnetic material, the method comprising:
   a) providing at least one layer of unfired magnetic material having a planar surface, said layer of unfired magnetic ceramic material to be referred to as the "unfired layer";
   b) creating at least one via through the unfired layer, the via having an inner side wall surface;
   c) coating, prior to step d), said inner side wall surface with conductive material to form a side wall conductive pathway;
   d) forming at least one aperture through the unfired layer such that at least one aperture edge intersects the via;
   e) metallizing at least a portion of the planar surface of the unfired layer such that the metallized surface portion forms a continuous region with the side wall conductive pathway to create a conductive winding about a portion of the unfired layer; and
   f) firing the unfired layer with the conductive winding formed thereon such that said metallized substrate of magnetic ceramic material results.

2. A method for making a device including at least one magnetic component, the device comprising a metallized substrate of ceramic magnetic material, the method comprising:
   providing at least one layer of unfired magnetic ceramic material having a planar surface, said layer of unfired magnetic ceramic material to be referred to as the "unfired layer";
   creating at least one aperture through the unfired layer, the aperture having an inner side wall surface;
   coating said inner side wall surface with conductive material;
   forming a plurality of vias through the unfired layer such that the vias intersect at least one aperture edge removing the conductive material on portions of the aperture side wall defining at least one side wall conductive pathway;
   metallizing at least a portion of the planar surface of the unfired layer such that the metallized surface portion forms a continuous conductive region with the side wall conductive pathway to create a conductive winding about a portion of the unfired layer; and
   firing the unfired layer with the conductive winding formed thereon such that said metallized substrate of magnetic ceramic material results.

3. A method according to claim 1 or 2, wherein said magnetic substrate comprises a ferrite.

4. A method according to claim 1 or 2, wherein said magnetic substrate comprises a nickel-zinc ferrite or a manganese-zinc ferrite.

5. A method according to claim 1 or 2, wherein said magnetic component comprises an inductor or a transformer.

6. A method according to claim 1 or 2, further comprising metallizing at least a portion of said planar surface to provide electronic circuit element interconnections on the substrate.

7. A method according to claim 1 or 2, further comprising plating additional metal upon said metallized portion and said side wall conductive pathway of said substrate of magnetic ceramic material.

8. A method according to claim 1 or 2, further comprising metallizing at least a portion of said planar surface to provide electronic circuit element interconnections on the substrate, and plating additional metal upon the interconnections.

9. A method according to claim 8 comprising plating at least 0.003 inches thickness of said additional metal.

10. A method according to claim 9, wherein said additional metal comprises copper.

11. A method according to claim 10, wherein said additional metal further comprises nickel.

12. A method according to claim 7 comprising plating at least 0.003 inches thickness of said additional metal.

* * * * *